US006946513B2

(12) United States Patent
Higashino et al.

(10) Patent No.: US 6,946,513 B2
(45) Date of Patent: Sep. 20, 2005

(54) POLYMER COMPOSITION CONTAINING CLEAN FILLER INCORPORATED THEREIN

(75) Inventors: Katsuhiko Higashino, Settsu (JP); Hiroyuki Tanaka, Settsu (JP); Takafumi Yamato, Settsu (JP); Tsuyoshi Noguchi, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 193 days.

(21) Appl. No.: 10/275,685

(22) PCT Filed: Apr. 27, 2001

(86) PCT No.: PCT/JP01/03686

§ 371 (c)(1), (2), (4) Date: Nov. 8, 2002

(87) PCT Pub. No.: WO01/85848

PCT Pub. Date: Nov. 15, 2001

(65) Prior Publication Data

US 2003/0149159 A1 Aug. 7, 2003

(30) Foreign Application Priority Data

May 9, 2000 (JP) ....................................... 2000-135820

(51) Int. Cl.[7] ......................... C08L 27/12; C08L 27/18; C08L 27/20; C08K 9/00; C08K 9/06

(52) U.S. Cl. ....................................... 524/544; 523/200

(58) Field of Search ................................ 524/492, 495, 524/430, 424, 418, 428, 544; 523/200, 212

(56) References Cited

U.S. PATENT DOCUMENTS 3,837,878 A 9/1974 Beers
4,529,774 A 7/1985 Evans et al.
4,849,022 A 7/1989 Kobayashi et al.
4,882,369 A * 11/1989 Maxson ...................... 523/213
5,498,657 A * 3/1996 Sugiyama et al. .......... 524/463
5,712,070 A * 1/1998 Nozawa et al. .......... 430/106.2
5,750,258 A * 5/1998 Sakai et al. ................. 428/405
5,977,243 A * 11/1999 Barthel et al. .............. 524/588
6,194,508 B1 * 2/2001 Achenbach et al. ........ 524/492

FOREIGN PATENT DOCUMENTS

JP 56-41263 A 4/1981
JP 63-156816 A 6/1988
JP 2-34658 A 2/1990
JP 3-287654 A 12/1991
JP 5-335446 A 12/1993

OTHER PUBLICATIONS

International Preliminary Examination Report for PCT/JP01/03686 dated Feb. 5, 2002.
Supplementary European Search Report for EP 01 92–6012 dated May 21, 2003.

* cited by examiner

*Primary Examiner*—Callie Shosho
(74) *Attorney, Agent, or Firm*—Sughrue Mion, PLLC

(57) ABSTRACT

There is provided an elastomer composition which is prepared by using a very clean filler reduced in both of an amount of moisture generation and an amount of organic outgas generation and is suitable as a molding material for semiconductor production apparatuses and there is provided a molded article. The composition is a crosslinkable composition comprising a high molecular weight polymer, particularly a crosslinkable fluorine-containing elastomer and a filler which has a weight reduction ratio per unit surface area of not more than $2.5\times10^{-5}$% by weight/$m^2$ when heating at 200° C. for two hours and a total amount of organic gas generated of not more than 2.5 ppm when heating at 200° C. for 15 minutes. The molded article is produced from the crosslinkable composition.

12 Claims, No Drawings

POLYMER COMPOSITION CONTAINING CLEAN FILLER INCORPORATED THEREIN

TECHNICAL FIELD

The present invention relates to a high molecular weight polymer composition prepared by using a very clean filler reduced in both of amounts of generating moisture and organic outgas, a molded article which can be suitably used for semiconductor production apparatuses, a cleaned filler used for the composition and a process for producing the filler.

BACKGROUND ART

Generally various inorganic fillers are added to high molecular weight polymers for reinforcement thereof. Those filler-containing polymers are used as materials for various parts for semiconductor production apparatuses which require a clean environment.

Recently a highly clean environment has been demanded in production of semiconductors in proportion to high performance of semiconductors. As a result, it is required not only to eliminate only micro-particles but also to minimize gaseous impurities generated in semiconductor production processes (generally called "impurity outgas").

Such impurity outgases encompass moisture and organic gases such as dioctyl phthalate (DOP). Firstly reduction of an amount of outgas generated from a high molecular weight polymer has been aimed at.

Further in consideration of necessity of highly cleaning a filler contained in a high molecular weight polymer material in relatively much amount, there was developed a method of firstly carrying out specific cleaning of the filler and then treating a surface of the filler with a silane coupling agent or the like to reduce an amount of hydroxyl around the surface of the filler, thereby reducing an amount of moisture generation.

However in that method, though generation of moisture outgas can be reduced considerably, generation of organic outgas is not decreased but is increased. Therefore further improvements are required.

The present inventors have found that in the treatment for cleaning of a filler, when the filler is heated in an inert gas stream after making a surface of the filler hydrophobic, generation of not only moisture outgas but also organic outgas can be reduced, and thus have completed the present invention.

DISCLOSURE OF INVENTION

Namely, the present invention relates to a high molecular weight polymer composition comprising a high molecular weight polymer and a filler, in which when the filler is heated at 200° C. for two hours, a weight reduction ratio per unit surface area thereof (hereinafter referred to simply as "weight reduction ratio") is not more than $2.5\times10^{-5}$% by weight/$m^2$, preferably not more than $2.0\times10^{-5}$% by weight/$m^2$, more preferably not more than $1.5\times10^{-5}$% by weight/$m^2$, and when the filler is heated at 200° C. for 15 minutes, a total amount of organic gas generated from the filler (hereinafter referred to simply as "amount of organic outgas") is not more than 2.5 ppm, preferably not more than 2.0 ppm, more preferably not more than 1.8 ppm.

Examples of the preferred high molecular weight polymer are crosslinkable elastomers, for instance, crosslinkable fluorine-containing elastomers, particularly crosslinkable perfluoro elastomers.

The high molecular weight polymer composition can provide a molded article in which an amount of moisture generated when the molded article is heated at 200° C. for 30 minutes (hereinafter simply referred to as "amount of moisture generation") is not more than 400 ppm, and an amount of organic outgas generated at that time is not more than 0.03 ppm, which could not be achieved by conventional methods of treating polymers and fillers.

The molded article of the present invention, particularly crosslinked elastomer molded article is suitable for parts for semiconductor production apparatuses, particularly for sealing materials used for sealing of semiconductor production apparatuses.

The present invention also relates to the above-mentioned specific filler highly cleaned.

Such a cleaned filler can be obtained by heat-treating a filler previously subjected to treatment for making its surface hydrophobic at a temperature of from 100° to 300° C. for 0.5 to 4 hours in a stream of an inert gas such as nitrogen gas.

Examples of a treating agent which can be used preferably for making the surface of the filler hydrophobic are a silylation agent, silicone oil, silane coupling agent and the like.

BEST MODE FOR CARRYING OUT THE INVENTION

It is desired that the filler which can be used suitably in the present invention is selected from the viewpoint of its dispersibility in a resin for a coating layer, chemical resistance, moisture absorption, plasma resistance, electromagnetic wave resistance and the like. Example thereof is at least one of metallic fillers such as metal oxides, metal nitrides, metal carbides, metal halides, metal sulfides, metal salts and metal hydroxides and carbon fillers such as carbon black, graphitized carbon and graphite. Particularly metallic fillers are preferred from the viewpoint of excellent plasma resistance thereof.

Examples of the metal oxide are, for instance, silicon oxide, barium oxide, titanium oxide, aluminum oxide, silver oxide, beryllium oxide, bismuth oxide, chromium oxide, boron oxide, cadmium oxide, copper oxide, iron oxide, gallium oxide, germanium oxide, hafnium oxide, iridium oxide, lanthanum oxide, lithium oxide, magnesium oxide, manganese oxide, molybdenum oxide, niobium oxide, neodymium oxide, nickel oxide, lead oxide, praseodymium oxide, rhodium oxide, antimony oxide, scandium oxide, tin oxide, strontium oxide, tantalum oxide, thorium oxide, vanadium oxide, tungsten oxide, zinc oxide, zirconium oxide and the like. From the viewpoint of excellent chemical resistance and chemical stability, silicon oxide, titanium oxide and aluminum oxide are preferred. Also silicon oxide is particularly preferred from the viewpoint of reinforcing property.

Examples of the metal nitride are, for instance, lithium nitride, titanium nitride, aluminum nitride, boron nitride, vanadium nitride, zirconium nitride and the like. From the viewpoint of excellent plasma resistance, chemical stability and industrial applicability, titanium nitride and aluminum nitride are preferred.

Examples of the metal carbides are, for instance, boron carbide, calcium carbide, iron carbide, manganese carbide, titanium carbide, silicon carbide, vanadium carbide, aluminum carbide and the like. From the viewpoint of excellent chemical resistance and chemical stability, silicon carbide and titanium carbide are preferred.

Examples of the metal halide are, for instance, metal chlorides and metal fluorides such as silver chloride, silver fluoride, aluminum chloride, aluminum fluoride, barium chloride, barium fluoride, calcium chloride, calcium fluoride, cadmium chloride, chromium chloride, cesium chloride, cesium fluoride, copper chloride, potassium chloride, potassium fluoride, lithium chloride, lithium fluoride, magnesium chloride, magnesium fluoride, manganese chloride, sodium chloride, sodium fluoride, nickel chloride, lead chloride, lead fluoride, rubidium chloride, rubidium fluoride, tin chloride, strontium chloride, thallium chloride, vanadium chloride, zinc chloride and zirconium chloride, and bromides and iodides thereof. From the viewpoint of little moisture absorption and excellent chemical stability, aluminum fluoride and barium fluoride are preferred.

The metal salts are those represented by the formula: MnAm (M is a metal, A is a residue of various inorganic acids, m and n are optionally decided depending on the respective valencies of M and A). For example, there are sulfates, carbonates, phosphates, titanates, silicates, nitrates, and the like of various metals. Examples thereof are, for instance, aluminum sulfate, barium carbonate, silver nitrate, barium nitrate, barium sulfate, barium titanate, calcium carbonate, calcium nitrate, calcium phosphate, calcium silicate, calcium titanate, cadmium sulfate, cobalt sulfate, copper sulfate, ferrous carbonate, iron silicate, iron titanate, potassium nitrate, potassium sulfate, lithium nitrate, magnesium carbonate, magnesium nitrate, magnesium silicate, magnesium titanate, magnesium carbonate, manganese sulfate, manganese silicate, sodium carbonate, sodium nitrate, sodium sulfate, sodium silicate, sodium titanate, nickel sulfate, lead carbonate, lead sulfate, strontium carbonate, strontium sulfate, strontium titanate, zinc carbonate, zinc sulfate, zinc titanate and the like. From the viewpoint of excellent plasma resistance and chemical stability, barium sulfate and aluminum sulfate are preferred.

Examples of the metal hydroxides are, for instance, calcium hydroxide, magnesium hydroxide and the like.

Examples of the metal sulfide are, for instance, silver sulfide, calcium sulfide, cadmium sulfide, cobalt sulfide, copper sulfide, iron sulfide, manganese sulfide, molybdenum disulfide, lead sulfide, tin sulfide, zinc sulfide, tungsten disulfide and the like.

Among them, the metallic fillers, particularly metal oxides, metal nitrides and metal carbides are particularly preferred generally from the viewpoint of little moisture absorption and excellent chemical resistance.

In addition to enhancement of plasma resistance, it is preferable to optionally select the filler depending on other characteristics required. For example, in case of a molded article such as a sealing material for oxygen plasma equipment which is exposed to strong oxygen plasma, silicon oxide, titanium oxide, aluminum oxide, aluminum fluoride, barium sulfate and the like are preferred, and in case of exposure to fluorine plasma, aluminum oxide, aluminum fluoride, barium sulfate, aluminum nitride and the like are preferred. Further in case of a sealing material which is used at a part where a heat eliminating mechanism is provided to prevent overheating of the sealing material and is required to have heat conductivity, graphitized carbon black, graphite and the like are preferred. Further in case of a removable seal at a rotation part which is required to have low friction property, molybdenum disulfide, boron carbide and the like are preferred, and in case of a seal in a microwave guide system which is exposed to high frequency electromagnetic wave, fillers such as aluminum oxide and silicon oxide which have low dielectric constant, low dielectric loss tangent and low dielectric loss are preferred. Also in case of reducing generation of anionic gas from the molded article, calcium carbonate, calcium hydroxide, silicon oxide and the like which have a function as an acid acceptor are preferred. Those fillers may be used in a mixture of two or more thereof.

The filler may be in the form of particle or fiber (or whisker). In case of particles, a particle size is not limited particularly. From the viewpoint of uniform dispersibility of the filler and from the point that a thin film can be formed, the particle size of the filler is not more than 5 μm, particularly not more than 1 μm, further not more than 0.5 μm. The lower limit of the particle size of the filler is decided depending on its kind.

In the present invention, the filler is subjected to treatment for making its surface hydrophobic, thereby greatly reducing an amount of moisture adsorbed on the surface of the filler. For that surface treatment, a hydrophobilizing agent for making the surface of the filler hydrophobic is used. Examples of the surface-hydrophobilizing agent which can be used suitably in the present invention are, for instance, a silylation agent, silicone oil, silane coupling agent and the like.

As the silylation agent, preferred are those represented by the formula (1):

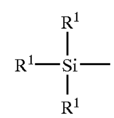

wherein $R^1$ are the same or different and each is an alkyl group having 1 to 4 carbon atoms. Examples of the silylation agent are, for instance, trimethylchlorosilane, dimethyldichlorosilane, hexamethyldisilazane, N,O-bis(trimethylsilyl)acetamide, N-trimethylsilylacetamide, N,N'-bis(trimethylsilyl)urea, N-trimethylsilyldiethylamine, N-trimethylsilylimidazole, t-butyldimethylchlorosilane and the like.

As the silicone oil, preferred are those represented by the formula (2):

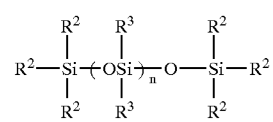

wherein $R^2$ are the same or different and each is an alkyl group having 1 to 4 carbon atoms or phenyl group, $R^3$ are the same or different and each is hydrogen atom, an alkyl group having 1 to 4 carbon atoms or phenyl group, n is an integer of from 1 to 10. Examples thereof are, for instance, dimethylsilicone oil and the like.

As the silane coupling agent, preferred are those represented by the formula (3):

$$R^4\text{—Si—}X_3$$

wherein $R^4$ is vinyl group, glycidyl group, methacryloxy group, amino group, mercapto group or the like, X is an alkoxyl group or halogen atom. Examples thereof are, for instance, vinyltrichlorosilane, vinyltris(β-methoxyethoxy)silane, vinyltriethoxysilane, vinyltrimethoxysilane, γ-(methacryloyloxypropyl)trimethoxysilane, β-(3,4- epoxycyclohexyl)ethyltrimethoxysilane, γ-glycidyloxypropyltrimethoxysilane, γ-glycidyloxypropylmethyldiethoxysilane, N-β-(aminoethyl)-γ-aminopropyltrimethoxysilane, N-β-(aminoethyl)-γ-aminopropylmethyldiethoxysilane, γ-aminopropyltriethoxysilane, N-phenyl-γ-aminopropyltrimethoxysilane, γ-mercaptopropyltrimethoxysilane, γ-chloropropyltrimethoxysilane and the like.

The treatment for making the surface of the filler hydrophobic with a silylation agent, silicone oil or silane coupling agent may be carried out, for example, by preparing a solution of a hydrophobilizing agent using water, alcohol (methanol, ethanol, isopropanol or the like), acetone, toluene or the like as a diluting solvent, soaking the filler in the solution, air-drying and then heat-treating in an inert gas stream. A concentration of the hydrophobilizing agent may be decided by calculating an amount of the hydrophobilizing agent necessary for forming a monomolecular layer from a specific surface area of the filler.

In the present invention, with respect to a preferred combination of a filler, a method of making the filler surface hydrophobic and a surface treating agent, any of a silylation agent, silicone oil and silane coupling agent can be used for the treatment of metal oxide fillers and mica, and a silicone oil or silane coupling agent is suitable for the treatment of carbon black and graphite. Particularly preferred are silicon oxides such as silica, aluminum oxide or titanium oxide treated with a silylation agent, silicone oil or silane coupling agent.

Fillers surface-treated with a silylation agent or a silane coupling agent are available on the market. Among them, those being highly hydrophobic can be used in the present invention as a filler surface-treated for hydrophobilization.

In the present invention, the filler surface-treated for hydrophobilization is then heat-treated in an inert gas stream. The treatment for making the surface of the filler hydrophobic can only reduce generation of moisture, and there remains a problem that an amount of generated organic outgas is increased because an organic substance attributable to an organic surface-treating agent remains on the surface of the filler. Therefore the heat treatment is carried out to solve this problem.

The heat treatment is carried out at a temperature of from 100° to 300° C. for 0.5 to 4 hours in an inert gas stream.

Examples of the inert gas are nitrogen gas, helium gas, argon gas and the like, and preferred is nitrogen gas. If the inert gas contaminated with impurities is used, the cleaning treatment is carried out in vain. Therefore an inert gas for semiconductor use is used. A flow rate of the inert gas is not limited particularly, but is decided on the basis of a rate which does not cause a compound evaporated or degraded to a gaseous form by heating to stay around the filler.

A heating temperature and time vary depending on kind of a filler surface-treated for hydrophobilization and to be heated (kind of a filler itself and kind of a surface-treating agent). An amount of generated organic outgas can be greatly reduced by heating in the above-mentioned temperature range of from 100° to 300° C. for 0.5 to 4 hours. The heating temperature and time are preferably from 100° to 250° C. for 0.5 to 3 hours, particularly preferably from 100° to 200° C. for 0.5 to 2 hours. If the heating temperature is too high, there is a case where even the surface-treating agent itself is decomposed and modified, and if the heating temperature is too low, there is a case where a residue of the surface-treating agent which has to be decomposed and eliminated remains without being decomposed. If the heating period of time is out of the above-mentioned range, there arise the same problems.

A weight reduction ratio of the so-obtained filler of the present invention is not more than $2.5\times10^{-5}$% by weight/m$^2$, further not more than $2.0\times10^{-5}$% by weight/m$^2$, particularly not more than $1.5\times10^{-5}$% by weight/m$^2$, and an amount of organic outgas generated from the filler is not more than 2.5 ppm, further not more than 2.0 ppm, particularly not more than 1.8 ppm. Thus the filler is a clean filler.

The weight reduction ratio is a factor for evaluating amounts of moisture and easily degradable organic compound which cause generation of outgas. As the ratio becomes lower, an amount of outgas (moisture and organic compound) generated at use becomes smaller. As mentioned above, with respect to an amount of moisture generated from conventional surface-treated filler, improvement has been made considerably. However an amount of generated organic outgas is relatively large. Therefore there exists no filler greatly reduced in generation of organic outgas like the present invention. Such a filler can be provided only by the present invention.

The clean filler of the present invention is useful for various compositions in combination with a high molecular weight polymer. A high molecular weight polymer to be combined with the filler is not limited particularly and various resins and elastomers can be used.

Examples of the resin are, for instance, a fluorine-containing resin, furan resin, vinyl acetate resin, vinyl chloride resin, vinylidene chloride resin, polyacrylonitrile, melamine resin, urea resin, phenol resin, polyamide resin, polystyrene, polyester, polyurethane, polyethylene, polypropylene, epoxy resin, polycarbonate, methacrylic resin, ABS resin and the like. Examples of the fluorine-containing resin are, for instance, polytetrafluoroethylene, tetrafluoroethylene/perfluoro(alkyl vinyl ether) copolymer, tetrafluoroethylene/hexafluoropropylene copolymer, polychlorotrifluoroethylene, polyvinylidene fluoride, ethylene/tetrafluoroethylene copolymer and the like. Particularly tetrafluoroethylene/perfluoro(alkyl vinyl ether) copolymer and polychlorotrifluoroethylene which are used in the field of production of semiconductors are preferred.

The filler of the present invention can be suitably used in combination with those resins for various molded articles (for example, gasket, tube, valve, cock, film, sheet and the like) and for coating. The molding method is not limited particularly and may be optionally selected from extrusion molding, compression molding, injection molding, blow molding, calender molding, transfer molding and the like.

Preferred elastomers are crosslinkable elastomers, and for example, there are a fluorine-containing elastomer, silicone elastomer, ethylene/vinyl acetate copolymer rubber, butadine rubber, chloroprene rubber, butyl rubber, isoprene rubber, styrene/butadiene copolymer rubber, nitrile rubber and the like.

The crosslinkable elastomer composition comprises the crosslinkable elastomer, the above-mentioned cleaned filler of the present invention and as case demands, a crosslinking agent and a crosslinking aid. When crosslinking with ultraviolet light or electron beam, the crosslinking agent and the like are not necessary.

An adding amount of the filler may be optionally selected, for example, from the viewpoint of reinforcement, and is usually from 1 to 50 parts by weight, preferably from 2 to 30 parts by weight based on 100 parts by weight of the fluorine-containing elastomer.

The crosslinkable elastomer composition of the present invention can be crosslinked and molded by various crosslinking systems depending on kind of a crosslinkable elastomer, kind of a crosslinking agent and the like. Crosslinking and molding conditions are not specific ones and may be optionally selected in the range of conventional conditions.

In the so-obtained molded article of the present invention, an amount of outgas generated therefrom is reduced significantly, namely an amount of moisture generation is not more than 400 ppm, further not more than 200 ppm, and an amount of generated organic outgas is not more than 0.03 ppm, further not more than 0.02 ppm. There are no conventional molded articles containing a filler, in which both of moisture and organic outgas are so greatly reduced. Such a molded article can be provided only by the present invention.

Among the above-mentioned crosslinkable elastomers, preferred are fluorine-containing elastomers and silicone elastomers in case of the use as a starting material of a sealing material for semiconductor production apparatuses.

Examples of the fluorine-containing elastomer are, for instance, (i) A perfluoro elastomer comprising from 40 to 90% by mole of tetrafluoroethylene, from 10 to 60% by mole of perfluoro(vinyl ether) represented by the formula (4):

$$CF_2{=}CF{-}OR_f$$

wherein Rf is a perfluoroalkyl group having 1 to 5 carbon atoms or a perfluoroalkyl(poly)ether group having 3 to 12 carbon atoms and 1 to 3 oxygen atoms, and from 0 to 5% by mole of a monomer giving a curing site, (ii) A vinylidene fluoride elastomer comprising from 30 to 90% by mole of vinylidene fluoride, from 15 to 40% by mole of hexafluoropropylene and from 0 to 30% by mole of tetrafluoroethylene, (iii) A thermoplastic perfluoro elastomer which is a fluorine-containing multi segment polymer having an elastomeric fluorine-containing polymer chain segment and a non-elastomeric fluorine-containing polymer chain segment, in which the elastomeric fluorine-containing polymer chain segment comprises from 40 to 90% by mole of tetrafluoroethylene, from 10 to 60% by mole of perfluoro (vinyl ether) represented by the formula (5):

$$CF_2{=}CF{-}OR_f$$

wherein $R_f$ is a perfluoroalkyl group having 1 to 5 carbon atoms or a perfluoroalkyl(poly)ether group having 3 to 12 carbon atoms and 1 to 3 oxygen atoms, and from 0 to 5% by mole of a monomer giving a curing site, and the non-elastomeric fluorine-containing polymer chain segment comprises from 85 to 100% by mole of tetrafluoroethylene and from 0 to 15% by mole of a compound represented by the formula (6):

$$CF_2{=}CF{-}R_f^1$$

wherein $R_f^1$ is $CF_3$ or $OR_f^2$, in which $R_f^2$ is a perfluoroalkyl group having 1 to 5 carbon atoms, (iv) A thermoplastic non-perfluoro elastomer which is a fluorine-containing multi segment polymer having an elastomeric fluorine-containing polymer chain segment and a non-elastomeric fluorine-containing polymer chain segment, in which the elastomeric fluorine-containing polymer chain segment comprises recurring units derived from 45 to 85% by mole of vinylidene fluoride and at least one other monomer copolymerizable with the vinylidene fluoride, respectively. Examples of the other monomer are hexafluoropropylene, tetrafluoroethylene, chlorotrifluoroethylene, trifluoroethylene, trifluoropropylene, tetrafluoropropylene, pentafluoropropylene, trifluorobutene, tetrafluoroisobutene, perfluoro(alkyl vinyl ether), vinyl fluoride, ethylene, propylene, alkyl vinyl ether and the like, (v) A cold resistant fluorine-containing elastomer obtained by radical polymerization in the presence of a diiodine compound and comprising from 0.005 to 1.5% by mole of a fluorinated vinyl ether unit containing iodine, from 40 to 90% by mole of a vinylidene fluoride unit and from 3 to 35% by mole of perfluoro(methyl vinyl ether) (as case demands, up to 25% by mole of hexafluoropropylene unit and/or up to 40% by mole of tetrafluoroethylene unit may be contained therein) (JP8-15753A), (vi) A copolymer of tetrafluoroethylene and propylene (U.S. Pat. No. 3,467,635) and the like.

Preferred silicone elastomers are, for example, silicone rubber, fluoro silicone rubber and the like.

The elastomer composition is crosslinked and molded into a desired form of product. For crosslinking, peroxide crosslinking is generally employed. Also there are other known crosslinking systems, for example, a triazine crosslinking system for forming a triazine ring with an organotin compound by using a fluorine-containing elastomer having a nitrile group introduced as a crosslinking point (for example, JP58-152041A), an oxazol crosslinking system for forming an oxazol ring with bisaminophenol similarly by using a fluorine-containing elastomer having a nitrile group introduced as a crosslinking point (for example, JP59-109546A), an imidazole crosslinking system for forming an imidazole ring with a tetraamine compound (for example, JP59-109546A) and a thiazole crosslinking system for forming a thiazole ring with bisaminothiophenol (for example, JP8-104789A). Also methods of crosslinking with radiation or electron beam may be employed.

Particularly preferred crosslinking agents are compounds having plural 3-amino-4-hydroxyphenyl groups, 3-amino-4-mercaptophenyl groups or 3,4-diaminophenyl groups. Examples thereof are, for instance, 2,2-bis(3-amino-4-hydroxyphenyl)hexafluoropropane (generally called bis (aminophenol)AF), 2,2-bis-(3-amino-4-mercaptophenyl) hexafluoropropane, tetraaminobenzene, bis-3,4-diaminophenylmethane, bis-3,4-diaminophenylether, 2,2-bis(3,4-diaminophenyl)hexafluoropropane and the like.

An adding amount of the crosslinking agent is preferably from 0.1 to 10 parts by weight based on 100 parts by weight of elastomer.

In case of the peroxide crosslinking, there can be used any of known organic peroxides which generate a peroxy radical under vulcanization temperature condition. Examples of the preferred organic peroxide are di-t-butyl peroxide, dicumyl peroxide, 2,5-dimethyl-2,5-di(benzoylperoxy)hexane, 2,5-dimethyl-2,5-di(t-butylperoxy)hexane, 1,1-bis(t-butylperoxy)-3,5,5-trimethylcyclohexane, 2,5-dimethylhexane-2,5-dihydroxyperoxide, t-butylcumyl peroxide, α,α'-bis(t-butylperoxy)-p-diisopropylbenzene, 2,5-dimethl-2,5-di(t-butylperoxy)hexyne-3, benzoyl peroxide, t-butylperoxybenzene, t-butlperoxymaleic acid, t-butylperoxyisopropyl carbonate and the like.

A content of the organic peroxide is usually from 0.05 to 10 parts by weight, preferably from 1 to 5 parts by weight based on 100 parts by weight of-the fluorine-containing elastomer.

If the content of the organic peroxide is smaller than 0.05 part by weight, a fluorine-containing elastomer is not crosslinked sufficiently, and on the contrary, if the content exceeds 10 parts by weight, physical properties of a crosslinked product are lowered.

In such a peroxide crosslinking, crosslinking aids such as polyfunctional co-crosslinking agents can be used. There can be used polyfunctional co-crosslinking agents which are used together with an organic peroxide in peroxide crosslinking of a fluorine-containing elastomer. Examples thereof are, for instance, bisolefins represented by triallyl cyanurate, trimethallyl isocyanurate, trially isocyanurate, trially formal, triallyl phosphate, triallyl trimellitate, N,N'-m-phenylenebismaleimide, dipropargyl terephthalate, diallyl phthalate, tetraallyl terephthalamide, tris(diallylamine)-s-triazine, triallyl phosphite, N,N-diallyacrylamide and 1,6-divinyldodecafluorohexane.

Also there is used suitably a fluorine-containing triallyl isocyanurate obtained by replacing a part of hydrogen atoms in three allyl groups of triallyl isocyanurate with fluorine atoms having higher heat resistance (cf. U.S. Pat. No. 4,320,216, WO98/00407, Zh. Prikl, Khim. (Leningrad) (1987, 60(3), 656–8 by Klenovich, S. V., et al.).

A content of the crosslinking aid is usually from 0.1 to 10 parts by weight, preferably from 0.5 to 5 parts by weight based on 100 parts by weight of the fluorine-containing elastomer.

In addition, a processing aid, internal releasing agent, etc. may be added to the composition. The peroxide crosslinking can be carried out by usual method and a crosslinking failure does not arise unlike conventional methods.

When the molded article of the present invention is treated by special cleaning methods described in WO99/49997, namely a cleaning method with ultrapure water, a method of cleaning with a clean organic compound being in the form of liquid at a cleaning temperature or a clean aqueous inorganic solution, a method of dry etch cleaning or a method of extraction cleaning, the number of microparticles and metal content can be reduced, and thus there can be obtained a highly cleaned molded article for semiconductor production apparatuses which is excellent in plasma resistance and is reduced in an amount of generated outgas.

The molded article of the present invention containing a filler can be applied to various molded articles, and is particularly suitable for various parts for semiconductor production apparatuses because an amount of outgas generated therefrom is significantly reduced.

Particularly the fluorine-containing elastomer molded article can be suitably used for production of sealing materials for sealing of semiconductor production apparatuses which are required to have high cleanliness. Examples of the sealing material are O-ring, square ring, gasket, packing, oil seal, bearing seal, lip seal, etc.

In addition, the molded article can be used as various elastomer products, for example, diaphragm, tube, hose and various rubber rolls, and also as a coating material and a lining material.

In the present invention, the semiconductor production apparatuses are not limited particularly to apparatuses for producing semiconductors and encompass whole manufacturing equipment used in the field of semiconductors where a high degree of cleanliness is required, such as equipment for manufacturing a liquid crystal panel and plasma panel.

Examples of the semiconductor production apparatuses are as follows.

(1) Etching system
- Dry etching equipment
  - Plasma etching machine
  - Reactive ion etching machine
  - Reactive ion beam etching machine
  - Sputter etching machine
  - Ion beam etching machine
- Wet etching equipment
- Ashing equipment (2) Cleaning system
- Dry etching cleaning equipment
  - $UV/O_3$ cleaning machine
  - Ion beam cleaning machine
  - Laser beam cleaning machine
  - Plasma cleaning machine
  - Gas etching cleaning machine
- Extractive cleaning equipment
  - Soxhlet extractive cleaning machine
  - High temperature high pressure extractive cleaning machine
  - Microwave extractive cleaning machine
  - Supercritical extractive cleaning machine (3) Exposing system
- Stepper
- Coater and developer (4) Polishing system
- CMP equipment (5) Film forming system
- CVD equipment
- Sputtering equipment (6) Diffusion and ion implantation system
- Oxidation and diffusion equipment
- Ion implantation equipment The present invention is then explained by means of examples, but is not limited to them.

EXAMPLE 1

(Production of Cleaned Filler)

A fumed silica available on the market (Cab-O-Sil M-7D available from Cabot Specialty Chemicals Co., Ltd., average particle size: 0.02 $\mu$m, specific surface area: 200 $m^2/g$) was subjected to treating for making its surface hydrophobic by using hexamethyldisilazane as a silylation agent, and 20 g of the treated filler was heat-treated at 200° C. for two hours in nitrogen gas stream (flow rate: 20 liter/min) to obtain a cleaned filler of the present invention.

A weight reduction ratio and an amount of generated organic outgas of the cleaned filler obtained by the heat-treatment were measured by the following methods. The results are shown in Table 1.

(Measurement of Weight Reduction Ratio)

An aluminum vessel is charged with 1.0 g of a sample (filler), and is heated at 200° C. for two hours in nitrogen gas stream. A weight (g) of the sample after the heating is measured. The weight after the heating is substituted for the following equation and a weight reduction ratio per unit surface area (% by weight/$m^2$) is calculated.

$$\text{Weight reduction ratio} = (\text{Weight before heating (g)} - \text{Weight after heating (g)}) + \text{Weight before heating (g)} + \text{Specific surface area } (m^2/g)$$

(Amount of Organic Outgas)

A sample (filler) is put in a glass tube in an amount of 0.1 gram and the tube is sealed. The tube is then heated at 200° C. for 15 minutes. A generated gas is collected in a trap tube cooled to −40° C. with liquid nitrogen and is then subjected to rapid heating. The gas is then fed to a gas chromatograph (GC-14A available from Shimadzu Corporation, column: UA-15 available from Shimadzu Corporation), and is analyzed. An amount of organic gas (ppm) is calculated from a peak area of the obtained chart.

EXAMPLE 2

(Production of Cleaned Filler)

A fumed silica available on the market (Cab-O-Sil M-7D, average particle size: 0.02 μm, specific surface area: 200 $m^2/g$) was subjected to treating for making its surface hydrophobic by using polydimethylsiloxane as a silicone oil, and 20 g of the treated filler was heat-treated at 200° C. for two hours in nitrogen gas stream (flow rate: 20 liter/min) to obtain a cleaned filler of the present invention.

A weight reduction ratio and an amount of generated organic outgas of the obtained cleaned filler after the heat-treating were measured in the same manner as in Example 1. The results are shown in Table 1.

EXAMPLE 3

(Production of Cleaned Filler)

Fine particles of aluminum oxide available on the market (AKP-G008 available from Sumitomo Chemical Industries, Ltd., average particle size: 0.02 μm, specific surface area: 150 $m^2/g$) were subjected to treating for making the surface thereof hydrophobic by using hexamethyldisilazane as a silylation agent, and 20 g of the treated filler was heat-treated at 200° C. for two hours in nitrogen gas stream (flow rate: 20 liter/min) to obtain a cleaned filler of the present invention.

COMPARATIVE EXAMPLE 3

With respect to the fine particles of aluminum oxide of Example 3 subjected to the treatment for making the surface thereof hydrophobic by using hexamethyldisilazane as a silylation agent, a weight reduction ratio and an amount of generated organic outgas of the fine particles of aluminum oxide before the heat-treating were measured in the same manner as in Example 1. The results are shown in Table 1.

COMPARATIVE EXAMPLE 4

With respect to the fumed silica (Cab-O-Sil available from Cabot Specialty Chemicals Co., Ltd., average particle size: 0.02 μm, specific surface area: 200 $m^2/g$) subjected to neither the treatment for making its surface hydrophobic nor the heat treatment, a weight reduction ratio and an amount of generated organic outgas were measured in the same manner as in Example 1. The results are shown in Table 1.

COMPARATIVE EXAMPLE 5

With respect to the fine particles of aluminum oxide (AKP-G008 available from Sumitomo Chemical Industries, Ltd., average particle size: 0.02 μm, specific surface area: 150 $m^2/g$) subjected to neither the treatment for making the surface thereof hydrophobic nor the heat treatment, a weight reduction ratio and an amount of generated organic outgas were measured in the same manner as in Example 1. The results are shown in Table 1.

TABLE 1

| | Kind of filler | Suface-hydrophobilizing agent | Heat treatment | Weight reduction ratio ($\times 10^{-5}$ % by weight/$m^2$) | Amount of organic outgas (ppm) |
|---|---|---|---|---|---|
| Ex. 1 | Silica | Hexamethyldisilazane | 200° C. × 2 hr | 0.1 | 0.06 |
| Ex. 2 | Silica | Polydimethylsiloxane | 200° C. × 2 hr | 1.3 | 0.06 |
| Ex. 3 | Aluminum oxide | Hexamethyldisilazane | 200° C. × 2 hr | 0.1 | 0.06 |
| Com. Ex. 1 | Silica | Hexamethyldisilazane | Not heat-treated | 0.1 | 2.71 |
| Com. Ex. 2 | Silica | Polydimethylsiloxane | Not heat-treated | 1.3 | 2.53 |
| Com. Ex. 3 | Aluminum oxide | Hexamethyldisilazane | Not heat-treated | 0.1 | 2.71 |
| Com. Ex. 4 | Silica | Not treated | Not heat-treated | 3.0 | 1.52 |
| Com. Ex. 5 | Aluminum oxide | Not treated | Not heat-treated | 4.0 | 1.47 |

A weight reduction ratio and an amount of generated organic outgas of the obtained cleaned filler after the heat-treating were measured in the same manner as in Example 1. The results are shown in Table 1.

COMPARATIVE EXAMPLE 1

With respect to the fumed silica of Example 1 subjected to the treatment for making its surface hydrophobic by using hexamethyldisilazane as a silylation agent, a weight reduction ratio and an amount of generated organic outgas of the fumed silica before the heat-treating were measured in the same manner as in Example 1. The results are shown in Table 1.

COMPARATIVE EXAMPLE 2

With respect to the fumed silica of Example 2 subjected to the treatment for making its surface hydrophobic by using polydimethylsiloxane as a silicone oil, a weight reduction ratio and an amount of generated organic outgas of the fumed silica before the heat-treating were measured in the same manner as in Example 1. The results are shown in Table 1.

As it is clear from Table 1, the weight reduction ratio (index for evaluating an amount of moisture generation) is large and the amount of generated organic outgas is large in the case of the fillers subjected to neither the treatment for making the surface thereof hydrophobic nor the heat treatment (Comparative Examples 4 and 5). With respect to the fillers subjected to the treatment for making the surface thereof hydrophobic (Comparative Examples 1 to 3), the weight reduction ratio is greatly reduced, but the amount of generated organic outgas is increased. The weight reduction ratio of the filler of the present invention subjected to the heat treatment in an inert gas stream is the same as that of the filler subjected to the treatment for making its surface hydrophobic but the amount of generated organic outgas is greatly reduced as compared with the filler not subjected to the treatment for making its surface hydrophobic, which indicates that a high cleanliness is achieved.

EXAMPLE 4

(Production of Crosslinked Elastomer)

A 6-liter stainless steel autoclave having no ignition source was charged with 2 liter of pure water, 20 g of $C_7F_{15}COONH_4$ as an emulsifying agent and 0.18 g of disodium hydrogenphosphate $12H_2O$ as a pH control agent. After the inside of a system was sufficiently replaced with nitrogen gas and deairing was carried out, the autoclave was heated to 50° C. with stirring at 600 rpm, and a gas mixture of tetrafluoroethylene (TFE)/perfluoro(methyl vinyl ether) (PMVE) (TFE/PMVE=20/80 in mole ratio) was introduced so that the inside pressure became 1.18 MPa·G. Then 2 ml of an aqueous solution of ammonium persulfate (APS) having a concentration of 186 mg/ml was introduced with pressurized nitrogen gas to initiate a reaction.

At the time when the inside pressure was lowered to 1.08 MPa·G with the advance of the polymerization, 4.0 g of diiodine compound $I(CF_2)_4I$ was introduced with pressurized nitrogen gas. Then a gas mixture of TFE and PMVE (19/23 in mole ratio) was introduced with a plunger pump and thus increasing and decreasing of the inside pressure were repeated between 1.08 MPa·G and 1.18 MPa·G.

When a total amount of the introduced TFE and PMVE reached 430 g, 511 g and 596 g, respectively, 1.5 g of $ICH_2CF_2CF_2OCF{=}CF_2$ was introduced under pressure. Also every 12 hours after starting of the reaction, 2 ml of an aqueous solution of APS having a concentration of 35 mg/ml was introduced with pressurized nitrogen gas. Thus the polymerization was continued, and 35 hours after starting of the reaction, the polymerization was terminated.

The obtained aqueous emulsion was frozen in dry ice/methanol for coagulation. Then after thawing, the coagulated product was washed with water and vacuum-dried to obtain an elastomeric copolymer. A Mooney viscosity ML1+10 (100° C.) of the polymer was 63.

As a result of $^{19}$F-NMR analysis, the obtained copolymer was a polymer comprising monomers of TFE/PMVE=59.2/40.8% by mole, and an iodine content obtained by an elementary analysis was 0.03% by weight.

With 100 g of the obtained tetrafluoroethylene/perfluoro(methyl vinyl ether) copolymer elastomer were kneaded 10 g of the filler produced in Examples 1 to 3 and Comparative Examples 1 to 5, respectively, 1.0 g of 2,5-dimethyl-di(t-butylperoxy)hexane (PERHEXA 2.5B available from NOF Corporation) and 3.0 g of triallyl isocyanurate (TAIC) (available from Nippon Kasei Kabushiki Kaisha) to obtain the elastomer composition of the present invention. Then the composition was subjected to press-crosslinking (primary crosslinking) by compression molding at 160° C. for 15 minutes to obtain O-rings (AS-568A-214).

The O-rings were washed with sufficiently much amount of $H_2SO_4/H_2O_2$ (6/4 in weight ratio) at 100° C. for 15 minutes with stirring and then with 5% HF at 25° C. for 15 minutes and further with boiling pure water at 100° C. for two hours. After that, the O-rings were subjected to crosslinking by heating at 200° C. for 24 hours in nitrogen gas stream (secondary crosslinking) and then drying to obtain sample O-rings.

With respect to the obtained O-rings, an amount of moisture generation (ppm) and an amount of organic outgas (ppm) were determined by the following methods. The results are shown in Table 2.

(Measurement of Amount of Moisture Generation)

The sample O-ring is heated at 200° C. for 30 minutes in nitrogen gas atmosphere, and an amount of generated moisture is measured with Karl Fischer moisture meter (available from Hiranuma Sangyo Kabushiki Kaisha).

(Measurement of Amount of Organic Outgas)

Measurement is made in the same manner as in Example 1 except that O-ring (AS-568A-214) is used as a sample.

TABLE 2

| | Filler used | | | Crosslinked elastomer | |
|---|---|---|---|---|---|
| Experiment No. | Example No. | Treatment for making filler surface hydrophobic | Heat treatment | Amount of moisture generated (ppm) | Amount of organic outgas (ppm) |
| Exp. 4-1 | Ex. 1 | Treated | Treated | 127 | 0.01 |
| Exp. 4-2 | Ex. 2 | Treated | Treated | 130 | 0.01 |
| Exp. 4-3 | Ex. 3 | Treated | Treated | 130 | 0.01 |
| Com. Exp. 4-1 | Com. Ex. 1 | Treated | Not heat-treated | 127 | 0.04 |
| Com. Exp. 4-2 | Com. Ex. 2 | Treated | Not heat-treated | 130 | 0.04 |
| Com. Exp. 4-3 | Com. Ex. 3 | Treated | Not heat-treated | 130 | 0.04 |
| Com. Exp. 4-4 | Com. Ex. 4 | Not treated | Not heat-treated | 506 | 0.01 |
| Com. Exp. 4-5 | Com. Ex. 5 | Not treated | Not heat-treated | 940 | 0.01 |

As it is clear from Table 2, in case of the crosslinked elastomer containing a filler not subjected to the treatment for making its surface hydrophobic (Comparative Experiments 4-4 and 4-5), an amount of generated organic outgas is small but an amount of generated moisture is large. In case of the crosslinked elastomer containing a filler subjected to the treatment for making its surface hydrophobic (Comparative Experiments 4-1 to 4-3), an amount of generated moisture is reduced greatly but an amount of generated organic outgas is increased. Further in case of the crosslinked product containing a filler of the present invention heat-treated in nitrogen gas stream, an amount of generated organic outgas of the crosslinked elastomer containing a filler subjected to the treatment for making its surface hydrophobic is lowered to the amount of generated organic outgas of the crosslinked elastomer containing a filler not subjected to the treatment for making its surface hydrophobic, which indicates that a highly cleaned crosslinked elastomer can be provided.

EXAMPLE 5

(Plasma Resistance)

Further in production of semiconductors, plasma irradiation treatment is carried out commonly, but in that plasma irradiation treatment, there are problems that a weight reduction of a sealing material such as O-ring occurs and micro-particles are generated.

The O-rings (AS-568A-214) produced by the methods mentioned above were put in a glass Petri dish and heated at 150° C. for 60 minutes in nitrogen gas atmosphere to obtain samples. With respect to the obtained samples, a weight reduction ratio and the number of generated micro-particles in the plasma irradiation step were measured by the following methods. The results are shown in Table 3.

(Weight Reduction)

The samples are subjected to plasma irradiation treatment under the following conditions and a weight reduction (% by weight) after the irradiation is measured to obtain a change in a weight thereof.

Plasma Irradiation Device:

PX-1000 available from Kabushiki Kaisha Samco International Kenkyusho of emitting light to ultrapure water containing micro-particles which was flowed into a sensor part and then electrically measuring amounts of transmitted light and scattered light with a submerged particle counter).

TABLE 3

| | | | | Crosslinked elastomer | | | |
|---|---|---|---|---|---|---|---|
| | Filler used | | | Amount of weight reduction (% by weight) | | Number of generated micro-particles ($\times10^4$/cm$^2$) | |
| Exp. No. | Ex. No. | Treatment for making filler surface hydrophobic | Heat treatment | Oxygen plasma | $CF_4$ plasma | Oxygen plasma | $CF_4$ plasma |
| Exp. 5-1 | Ex. 1 | Treated | Heat-treated | 0.31 | 0.35 | 0.61 | 0.37 |
| Exp. 5-2 | Ex. 2 | Treated | Heat-treated | 0.32 | 0.37 | 0.63 | 0.36 |
| Exp. 5-3 | Ex. 3 | Treated | Heat-treated | 0.30 | 0.19 | 0.78 | 0.87 |
| Com. Exp. 5-1 | Com. Ex. 1 | Treated | Not heat-treated | 0.31 | 0.35 | 0.61 | 0.37 |
| Com. Exp. 5-2 | Com. Ex. 2 | Treated | Not heat-treated | 0.32 | 0.37 | 0.63 | 0.36 |
| Com. Exp. 5-3 | Com. Ex. 3 | Treated | Not heat-treated | 0.30 | 0.19 | 0.78 | 0.87 |
| Com. Exp. 5-4 | Com. Ex. 4 | Not treated | Not heat-treated | 0.34 | 0.38 | 0.65 | 0.39 |
| Com. Exp. 5-5 | Com. Ex. 5 | Not treated | Not heat-treated | 0.30 | 0.19 | 0.78 | 0.87 |

Irradiation Conditions:

Oxygen ($O_2$) plasma irradiation treatment
- Gas flow: 200 sccm
- RF output: 400 W
- Pressure: 300 mTorr
- Irradiation time: 3 hours
- Frequency: 13.56 MHz $CF_4$ plasma irradiation treatment
- Gas flow: 200 sccm
- RF output: 400 W
- Pressure: 300 mTorr
- Irradiation time: 3 hours
- Frequency: 13.56 MHz Irradiation Procedure:

In order to stabilize an atmosphere in a chamber of the plasma irradiation device, actual gas discharge is carried out for five minutes for pre-treatment inside the chamber. Then the Petri dish with the sample put therein is disposed around a center of RF electrode, and is irradiated under the above-mentioned irradiation conditions.

Measurement of Weight:

An amount of weight reduction is measured up to two decimals (0.01 mg) with an electronic balance Model 2006MPE available from Sartorius GMBH, and is rounded to one decimal.

For the measurement of weight reduction, three pieces of samples are used per one kind of sample and an average thereof is used.

(Number of Generated Micro-particles)

An oxygen plasma or $CF_4$ plasma is generated under the conditions of a vacuum pressure of 50 mTorr, oxygen or $CF_4$ flow rate of 200 cc/min, electric power of 400 W and a frequency of 13.56 MHz by using a Plasma Dry Cleaner model PX-1000 available from Kabushiki Kaisha Samco International Kenkyusho. The sample (O-ring) is irradiated with the oxygen plasma or $CF_4$ plasma for three hours under reactive ion etching (RIE) conditions. After completion of the irradiation, an ultrasonic wave is applied to the sample in ultrapure water at 25° C. for one hour to liberate free micro-particles in water, and then the number of micro-particles (per liter) having a particle size of not less than 0.2 $\mu$m is measured by a fine particle meter method (a method It can be seen from Table 3 that the treated filler of the present invention is not greatly influenced by a plasma in the plasma treatment step like the non-treated filler or the filler subjected to only the treatment for making its surface hydrophobic.

INDUSTRIAL APPLICABILITY

In the filler of the present invention subjected to the heat treatment after the treatment for making its surface hydrophobic, both of an amount of generated moisture and an amount of generated organic outgas are reduced. Therefore the filler of the present invention is very clean and can be used to provide an elastomer composition suitable as a material for a molded article for semiconductor production apparatuses and to provide the molded article.

What is claimed is:

1. A fluorine-containing crosslinkable elastomer composition comprising a fluorine-containing crosslinkable elastomer other than a fluorosilicone rubber and a filler, in which when the filler is heated at 200° C. for two hours, a weight reduction ratio per unit surface area of the filler is not more than $2.5\times10^{-5}$% by weight/m$^2$ and when the filler is heated at 200° C. for 15 minutes, a total amount of organic gas generated from the filler is not more than 2.5 ppm;

said filler is subjected to treatment for making its surface hydrophobic and then heat-treated to remove volatile components prior to blending with the fluorine-containing crosslinkable elastomer.

2. The composition of claim 1, wherein the fluorine-containing crosslinkable elastomer is a crosslinkable perfluoro elastomer.

3. A molded article which is obtained from the polymer composition of claim 2, in which when the molded article is heated at 200° C. for 30 minutes, an amount of generated moisture is not more than 400 ppm and a total amount of generated organic outgas is not more than 0.03 ppm.

4. A molded article which is obtained from the polymer composition of claim 1, in which when the molded article is heated at 200° C. for 30 minutes, an amount of generated moisture is not more than 400 ppm and a total amount of generated organic outgas is not more than 0.03 ppm.

5. The molded article of claim 4 which is used for parts for semiconductor production apparatuses.

6. The molded article of claim 5 which is used as a sealing material for sealing of semiconductor production apparatuses.

7. The molded article of claim 4, wherein the filler has the weight reduction ratio per unit surface area of not more than $1.5\times10^{-5}$% by weight/$m^2$.

8. The molded article of claim 4, wherein the filler has the total amount of generated organic gas of not more than 1.8 ppm.

9. The molded article of claim 4, wherein the filler is prepared by heat-treating the filler after having been subjected to treatment for making its surface hydrophobic at a temperature of from 100° to 300° for 0.5 to 4 hours in an inert gas stream.

10. The composition of claim 1, wherein the filler has the weight reduction ratio per unit surface area of not more than $1.5\times10^{-5}$% by weight/$m^2$.

11. The composition of claim 1, wherein the filler has the total amount of generated organic gas of not more than 1.8 ppm.

12. The composition of claim 1, wherein the filler is prepared by heat-treating the filler after having been subjected to treatment for making its surface hydrophobic at a temperature of from 100° to 300° for 0.5 to 4 hours in an inert gas stream.

* * * * *